(12) United States Patent
Vogeley

(10) Patent No.: US 7,409,902 B2
(45) Date of Patent: Aug. 12, 2008

(54) ACTUATORS WITH CONNECTED DIAPHRAGMS

(75) Inventor: James Vogeley, Yorktown, VA (US)

(73) Assignee: Adaptivenergy, LLC., Hampton, VA (US)

( * ) Notice: Subject to any disclaimer, the term of this patent is extended or adjusted under 35 U.S.C. 154(b) by 71 days.

(21) Appl. No.: 11/279,648

(22) Filed: Apr. 13, 2006

(65) Prior Publication Data

US 2006/0245950 A1 Nov. 2, 2006

Related U.S. Application Data

(63) Continuation-in-part of application No. 11/024,943, filed on Dec. 30, 2004, now Pat. No. 7,322,803, which is a continuation-in-part of application No. 11/104,670, filed on Apr. 13, 2005, now Pat. No. 7,267,043.

(60) Provisional application No. 60/771,452, filed on Feb. 9, 2006.

(51) Int. Cl.
F16J 3/00 (2006.01)
F01B 19/02 (2006.01)

(52) U.S. Cl. .......................... 92/103 R; 92/96

(58) Field of Classification Search ............... 60/545; 92/96, 97, 103 R; 417/413.2; 310/331
See application file for complete search history.

(56) References Cited

U.S. PATENT DOCUMENTS

| | | | | |
|---|---|---|---|---|
| 1,032,194 | A | * | 7/1912 | Evans et al. ............... 92/40 |
| 4,401,857 | A | | 8/1983 | Morikawa |
| 4,773,218 | A | | 9/1988 | Wakita et al. |
| 4,853,579 | A | | 8/1989 | Kawasaki et al. |
| 4,927,084 | A | * | 5/1990 | Brandner et al. ............ 310/331 |
| 4,939,405 | A | | 7/1990 | Okuyama et al. |
| 5,070,848 | A | | 12/1991 | Mitsuyasu |
| 5,085,562 | A | | 2/1992 | van Lintel |
| 5,759,015 | A | | 6/1998 | Van Lintel et al. |
| 5,811,911 | A | | 9/1998 | Jänker et al. |
| 5,816,780 | A | | 10/1998 | Bishop et al. |
| 6,042,345 | A | | 3/2000 | Bishop et al. |
| 6,120,264 | A | | 9/2000 | Wang |
| 6,229,245 | B1 | | 5/2001 | Kitani |

(Continued)

FOREIGN PATENT DOCUMENTS

JP 57-199399 A 12/1982

(Continued)

OTHER PUBLICATIONS

International Preliminary Report on Patentability mailed Jul. 12, 2007 in corresponding PCT application PCT/US2005/047355.

(Continued)

*Primary Examiner*—Michael Leslie
(74) *Attorney, Agent, or Firm*—Nixon & Vanderhye, P.C.

(57) ABSTRACT

An actuator assembly comprises a first diaphragm (422) and a second diaphragm (424) connected to the first diaphragm for forming a chamber (426) between the first diaphragm and the second diaphragm. An actuator shaft (427) is connected to first diaphragm (422) and is oriented to extend through the chamber (426) and to extend through an aperture formed in the second diaphragm (424). The second diaphragm (424) can be connected to an actuator body (450) wherein the actuator shaft (427) performs an actuation operation. Alternatively, one or more actuator amplification assemblies (400(B)) can be interposed between the second diaphragm and the actuator body.

15 Claims, 11 Drawing Sheets

U.S. PATENT DOCUMENTS

| | | |
|---|---|---|
| 6,246,152 B1 | 6/2001 | Fontanella et al. |
| 6,411,009 B2 | 6/2002 | Jaenker |
| 6,637,200 B2 | 10/2003 | Barba et al. |
| 6,659,978 B1 | 12/2003 | Kasuga et al. |
| 6,751,954 B2 | 6/2004 | Bridger et al. |
| 6,761,028 B2 | 7/2004 | Takeuchi et al. |
| 6,784,599 B1 | 8/2004 | Stoecktein et al. |
| 6,811,093 B2 * | 11/2004 | Rado .......................... 310/328 |
| 6,869,275 B2 | 3/2005 | Dante et al. |
| 6,969,941 B1 | 11/2005 | Kapps et al. |
| 7,267,043 B2 | 9/2007 | Wright et al. |
| 2004/0018100 A1 | 1/2004 | Takagi et al. |
| 2005/0244288 A1 | 11/2005 | O'Neill |
| 2005/0258715 A1 | 11/2005 | Schlabach |
| 2006/0146096 A1 | 7/2006 | Wright et al. |
| 2006/0147325 A1 | 7/2006 | Vogeley |

FOREIGN PATENT DOCUMENTS

| | | |
|---|---|---|
| JP | 57-211562 | 12/1982 |
| JP | 62-150051 | 7/1987 |
| JP | 62-186077 | 8/1987 |
| JP | 02-248671 | 10/1990 |
| JP | 03-015674 | 1/1991 |
| JP | 03-168373 | 7/1991 |
| JP | 06-117377 | 4/1994 |

OTHER PUBLICATIONS

International Preliminary Report on Patentability mailed Jul. 12, 2007 in corresponding PCT application PCT/US2005/047356.

International Search Report and Written Opinion mailed Nov. 21, 2006 in PCT application PCT/US2006/13857.

* cited by examiner

ACTUATORS WITH CONNECTED DIAPHRAGMS

This application is a continuation-in-part of U.S. patent application Ser. No. 11/024,943, filed Dec. 30, 2004 now U.S. Pat. No. 7,322,803, entitled "PUMPS WITH DIAPHRAGMS BONDEDAS BELLOWS", and U.S. patent application Ser. No. 11/104,670, filed Apr. 13, 2005 now U.S. Pat. No. 7,267,043, entitled "ACTUATORS WITH DIAPHRAGM AND METHODS OF OPERATING SAME", both of which are incorporated by reference herein in their entirety. This application claims the priority and benefit of the following U.S. Provisional Patent Application, which is incorporated by reference herein in its entirety: U.S. Provisional Patent Application 60/771,452, filed Feb. 9, 2006, entitled "ACTUATORS WITH CONNECTED DIAPHRAGMS".

BACKGROUND

1. Field of the Invention

The present invention pertains to actuators, such as mechanical actuators, for example.

2. Related Art and Other Considerations

Actuators are utilized for numerous technical applications. Many actuators are of a type which have a moveable shaft or a piston which selectively extends and retracts. Upon extension the actuator shaft may, by contacting another mechanical or electrical element, either initiate/enable or cease/disable a particular operation. Alternatively, the actuator shaft may take the form of a valving element, such as a spool in a spool valve, for selectively facilitating, e.g., fluid flow through the valve.

The degree and accuracy of actuator shaft extension, and the amount of signaling required to accomplish the actuator shaft extension/retraction, can be problematic. What is needed, therefore, and an object of the present invention, is technique, method, and apparatus for controlling actuator shaft movement.

BRIEF SUMMARY

An actuator assembly comprises a first diaphragm and a second diaphragm connected to the first diaphragm for forming a chamber between the first diaphragm and the second diaphragm. An actuator shaft is connected to first diaphragm and is oriented to extend through the chamber and to extend through an aperture formed in the second diaphragm. The second diaphragm can be connected to an actuator body wherein the actuator shaft performs an actuation operation. Alternatively, one or more actuator amplification assemblies can be interposed between the second diaphragm and the actuator body.

In an illustrated example embodiment, at least one of the first diaphragm and the second diaphragm is a piezoelectric diaphragm which displaces in accordance with application of an electrical signal. Accordingly, the actuator assembly can be provided with a source of the electrical signal for displacing the first diaphragm and the second diaphragm.

In terms of connecting of the first diaphragm and the second diaphragm, the first diaphragm has a first diaphragm peripheral edge and the second diaphragm has a second diaphragm peripheral edge. The second diaphragm peripheral edge is connected to the first diaphragm peripheral edge, either substantially entirely around a periphery of the actuator assembly or at discrete peripheral points around the actuator assembly.

In an example embodiment, the first diaphragm and the second diaphragm are preferably oriented so that their displacements (upon application of an electrical signal) are additive. For example, a displacement X1 of the first diaphragm (from its rest position to a desired deflected position) and a displacement X2 of the second diaphragm (from its rest position to a desired deflected position) results in a displacement X1+X2 of the actuator shaft. In an illustrated example embodiment, the first diaphragm and the second diaphragm are essentially identical with respect to displacement upon application of a same electrical signal, so that X1=X2.

In one non-limiting, example embodiment, with respect to an interior of the chamber both the first diaphragm and the second diaphragm are concave. In the dual concave embodiment, both the first diaphragm and the second diaphragm have a same polarity signal applied thereto for activating the first diaphragm and the second diaphragm, and thereby displacing the actuator shaft by a displacement amount that is additive with respect to the displacements of the first diaphragm and the second diaphragm.

In another non-limiting, example embodiment, with respect to an interior of the chamber one of the first diaphragm and the second diaphragm is concave and the other of the first diaphragm and the second diaphragm is convex. In this concave/convex embodiment, the first diaphragm and the second diaphragm have opposite polarity signals applied thereto for displacing the first diaphragm and the second diaphragm. In the concave/convex configuration, not only is the actuator shaft displaced by a displacement amount that is additive with respect to the displacements of the first diaphragm and the second diaphragm, but a temperature compensation benefit is also obtained.

As mentioned above, the actuator assembly can be connected directly to an actuator body. In this respect, the second diaphragm can have a port which at least partially defines the aperture of the second diaphragm. The port of the second diaphragm can be configured for mating with the actuator body. The actuator shaft is operable to extend into the actuator body. The actuator body can be (as one non-limiting example) a spool valve body for which the actuator shaft acts as a spool.

Alternatively, the port of the second diaphragm can be configured for mating with an actuator amplification assembly. In an illustrated, non-limiting, example embodiment, the actuator amplification assembly comprises a first actuator amplification assembly diaphragm connected to a second actuator amplification assembly diaphragm for forming an actuator amplification assembly chamber therebetween. The first actuator amplification assembly diaphragm has an actuator amplification assembly first diaphragm port configured for mating with the port of the second diaphragm, the second actuator amplification assembly diaphragm has an actuator amplification assembly second diaphragm port configured for mating with either a port of a further actuator amplification assembly or an actuator body. The actuator shaft, in addition to extending through the chamber defined by the first diaphragm and the second diaphragm, also extends through the actuator amplification assembly first diaphragm port, through the actuator amplification assembly chamber, and protrudes from the actuator amplification assembly second diaphragm port. One or more actuator amplification assemblies can be telescoped together for amplifying the displacement of the actuator shaft. A terminal one of the actuator amplification assemblies preferably has a port configured for mating with an actuator body within which the actuator shaft is operable for performing its selective function.

The second diaphragm port, or ports formed on the actuator amplification assembly(ies) can be configured for mating in various ways, such as by internal (female) or external (male) threading, for example.

BRIEF DESCRIPTION OF THE DRAWINGS

The foregoing and other objects, features, and advantages of the invention will be apparent from the following more particular description of preferred embodiments as illustrated in the accompanying drawings in which reference characters refer to the same parts throughout the various views. The drawings are not necessarily to scale, emphasis instead being placed upon illustrating the principles of the invention.

DETAILED DESCRIPTION OF THE DRAWINGS

In the following description, for purposes of explanation and not limitation, specific details are set forth such as particular architectures, interfaces, techniques, etc. in order to provide a thorough understanding of the present invention. However, it will be apparent to those skilled in the art that the present invention may be practiced in other embodiments that depart from these specific details. That is, those skilled in the art will be able to devise various arrangements which, although not explicitly described or shown herein, embody the principles of the invention and are included within its spirit and scope. In some instances, detailed descriptions of well-known devices, circuits, and methods are omitted so as not to obscure the description of the present invention with unnecessary detail. All statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Figure 1:
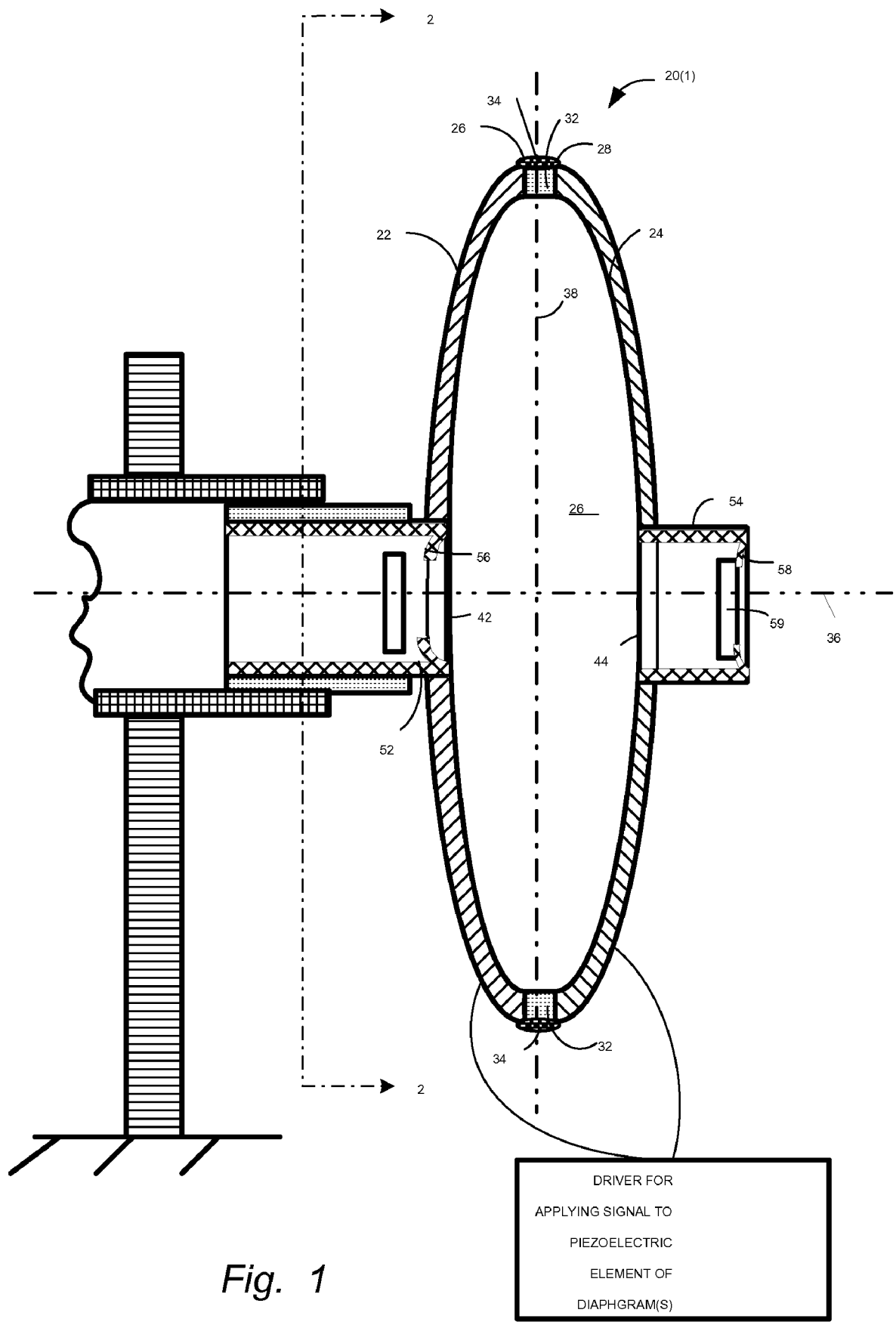
FIG. 1 is a cross sectioned side view of an example, non-limiting embodiment of a pump, the pump having diaphragms bonded to form a chamber which serves as a pumping chamber.
Figure 2:
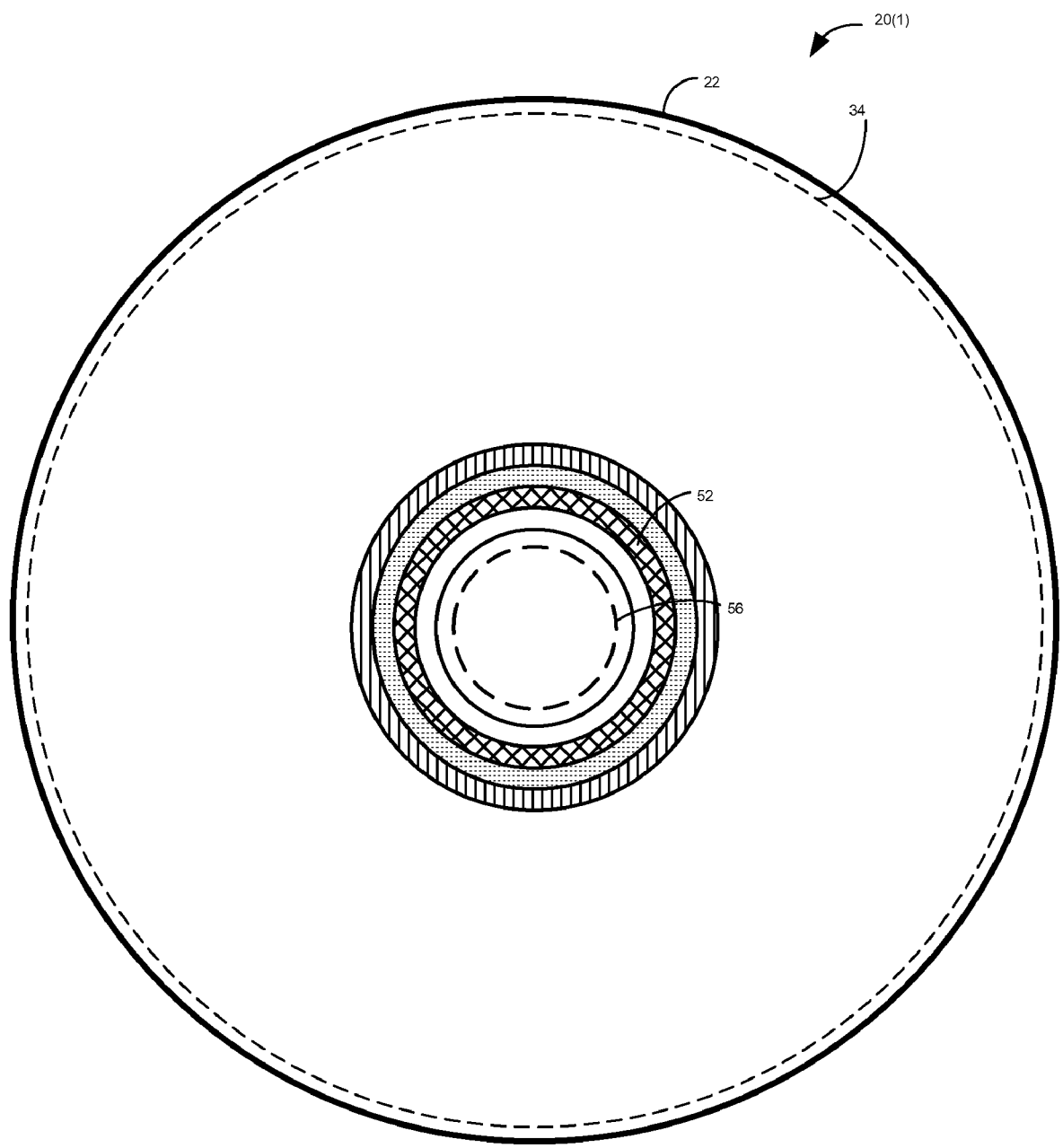
FIG. 2 is a front view of the pump of FIG. 1 taken along line 2-2.

U.S. patent application Ser. No. 11,024,943, filed Dec. 30, 2004, entitled "PUMPS WITH DIAPHRAGMS BONDEDAS BELLOWS" and incorporated by reference herein, discloses, among its many embodiments, a pump such pump 20(1) illustrated in FIG. 1 and FIG. 2. Pump 20(1) has a diaphragm assembly comprising two diaphragms, i.e., diaphragm 22 and diaphragm 24, which have their respective edges or peripheries at least partially bonded together to form a bellows chamber 26 between the diaphragm 22 and diaphragm 24. For example, in the first embodiment the first diaphragm 22 has its edge 28 bonded to edge 30 of second diaphragm 24, so that the first diaphragm 22 and the second diaphragm 24 are bonded together essentially entirely around their peripheries. The first diaphragm 22 and the second diaphragm 24 bow outwardly together and shrink in diameter during a suction stroke (e.g., intake stroke) but flatten out and increase in diameter during a pump stroke (e.g., exhaust stroke). FIG. 1 shows the pump 20(1) as an electrical signal is being applied to move the diaphragm assembly from the full pump stroke to the full suction stroke.

Pump 20(1) comprises a diaphragm assembly which includes a first diaphragm 22 having a first diaphragm edge 28 and a second diaphragm 24 having a second diaphragm edge 30. The first diaphragm edge 28 and the second diaphragm edge 30 are bonded together so that a chamber 26 is formed between the first diaphragm 22 and the second diaphragm 24. At least one and possibly both of the first diaphragm 22 and the second diaphragm 24 is a piezoelectric diaphragm which displaces in accordance with application of an electrical signal. A driver applies the electrical signal to whichever of the first diaphragm 22 and the second diaphragm 24 is the piezoelectric diaphragm. The first diaphragm 22 and the second diaphragm 24 bow outwardly together and shrink in diameter during a suction stroke (e.g., intake stroke) but flatten out and increase in diameter during a pump stroke (e.g., exhaust stroke).

In the particular example embodiment of FIG. 1, an inlet port 42 is formed as a hole or opening in a central region of the first diaphragm 22 and an outlet port 44 is formed as a hole or opening in a central region of the second diaphragm 24. An inlet valve 52 is provided at the inlet port 42 and an outlet valve 54 is provided at the outlet port 44. In the embodiment of FIG. 1, the first diaphragm 22 and the second diaphragm 24 chamber 26 forms and serves as a pumping chamber. Fluid is admitted into the pumping chamber 26 through the inlet port 42 and expelled from the pumping chamber through the outlet port 44. In this regard, inlet valve 52 is closed on a suction stroke of the pump but is open on a pump stroke. The outlet valve 54 is open during the suction stroke but driven closed on the pump stroke. The inlet valve 52 and outlet valve 54 can be, e.g., simple check valves or other valves known to the person skilled in the art.

The bonding of diaphragm 22 and diaphragm 24 can be realized in various ways. For example, a sealing gasket 32 may be inserted between edge 28 of diaphragm 22 and edge 30 of diaphragm 24, and an epoxy 34 or other adhesive or sealant applied externally over edge 28, edge 30, and sealing gasket 32. For example, in one non-limiting embodiment, the sealing gasket 32 and epoxy 34 reside essentially completely around the edges of the diaphragm 22 and diaphragm 24.

Figure 3:
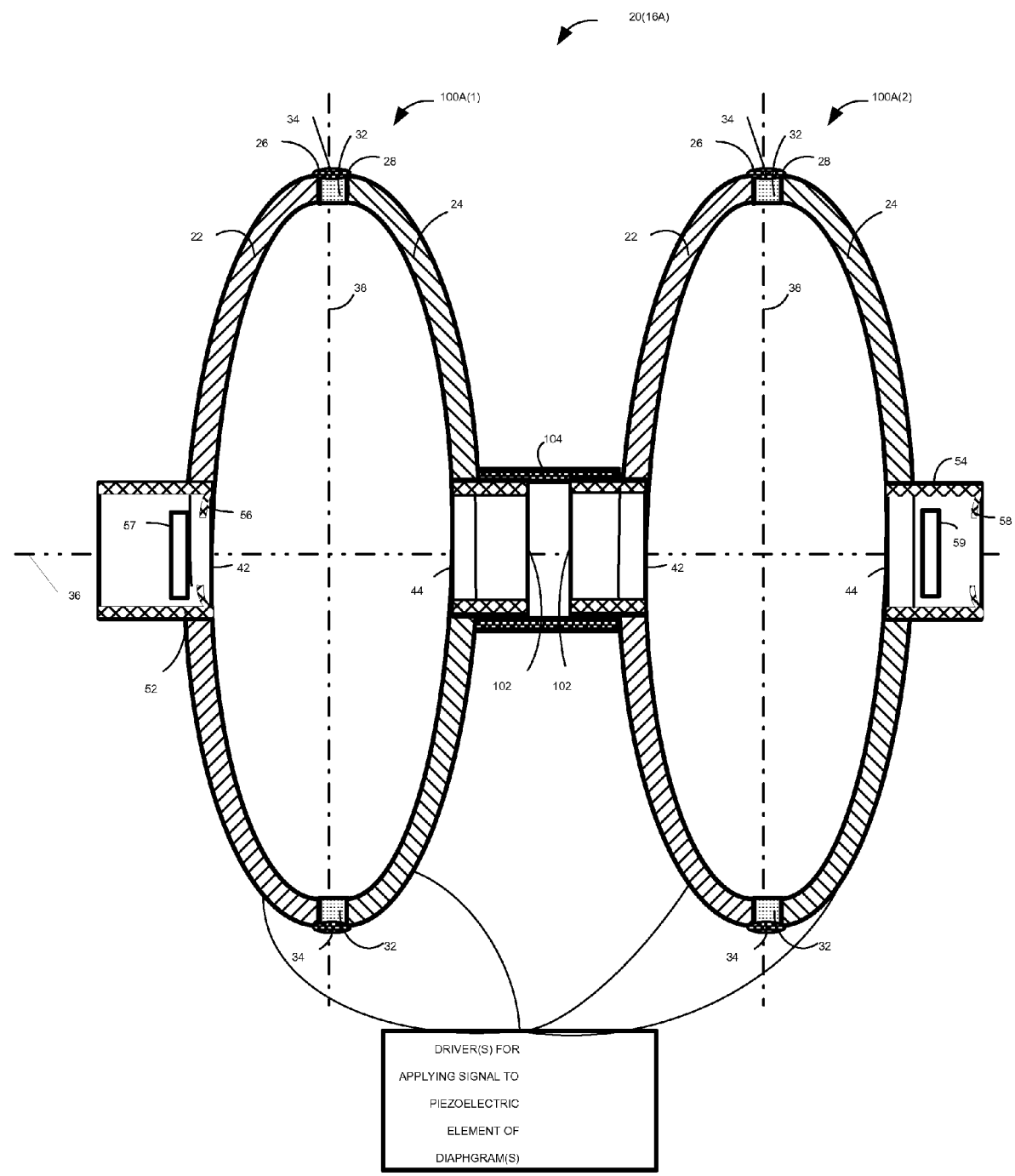
FIG. 3 is a cross sectioned side view of a pump according to an example embodiment wherein modular pump sections are cascaded together.

U.S. patent application Ser. No. 11/024,943, filed Dec. 30, 2004, entitled "PUMPS WITH DIAPHRAGMS BONDED AS BELLOWS" and incorporated by reference herein, also discloses, among its many embodiments, a pump 20(16A) such as that shown in FIG. 3. Pump 20(16A) comprises plural modular pump sections (e.g., pump components) cascaded together. Particularly shown in FIG. 3 are two example modular pump sections, i.e., modular pump section 100A(1) and modular pump section 100A(2). More than two modular pump sections may be similarly cascaded or connected together. It so happens that each of the modular pump sections of FIG. 3 basically resembles the pump 20(1) of FIG. 1 and FIG. 2. Such resemblance includes each modular pump section 100 comprising a first diaphragm 22 having a first diaphragm edge 28; a second diaphragm 24 having a second diaphragm edge 30; the first diaphragm edge 28 and the second diaphragm edge 30 being bonded together so that a pumping chamber 26 is formed between the first diaphragm 22 and the second diaphragm 24. Moreover, in an example implementation, for each of the modular pump sections at least one of the first diaphragm and the second diaphragm is a piezoelectric diaphragm which displaces in accordance with application of an electrical signal. The modular pump sections 100A differ from those of the first embodiment in that, depending on placement of the modular pump section 100A in the overall cascading scheme, the modular pump section 100A will have either one or no valves (rather than having two valves). For example, modular pump section 100A(1) has an inlet valve 52 at its inlet port 42, but at its outlet port 44 has only a port extension 102. Similarly, modular pump section 100A(2) has an outlet valve 54 at its outlet port 44, but at its inlet port 42 has only port extension 102. Had a third modular pump section been provided between modular pump section 100A(1) and modular pump section 100A(2), the inlet port and outlet port of such third modular pump section would both have port extensions and no valves. Each modular pump section serves as a pump component. A connector sleeve 104 is provided for connecting either an outlet valve 54 to a port extension 102, or for connecting two port extensions 102 together.

Remaining embodiments described herein illustrate that edge-connected diaphragm assemblies have employment in implementations other than pumps. For example, various embodiments hereinafter described show how pairs of edge-connected diaphragms can be configured for use in an actuator assembly.

Figure 4:
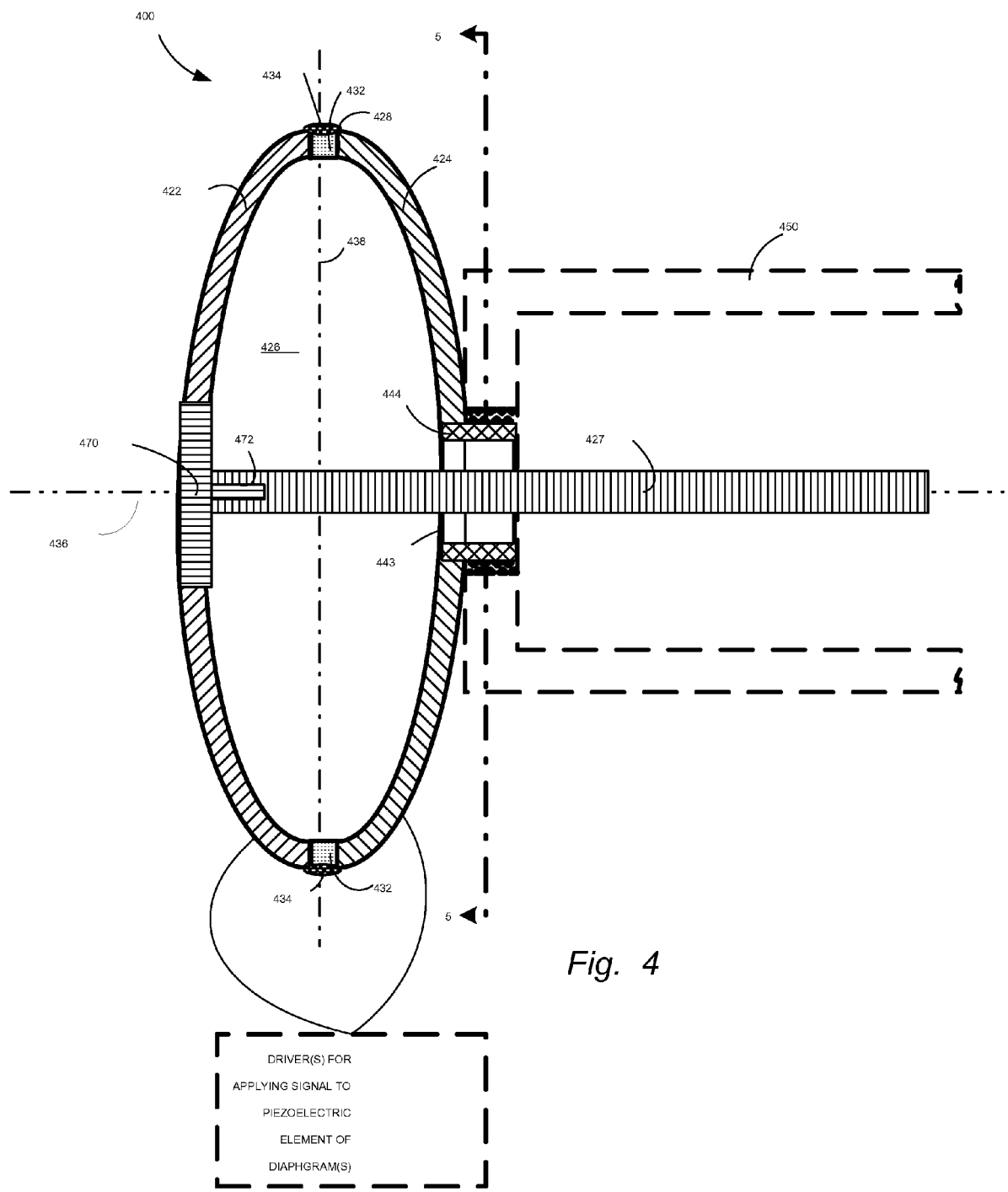
FIG. 4 is a cross sectioned side view of an example, non-limiting embodiment of an actuator assembly, the actuator assembly having diaphragms bonded to form a chamber through which an actuator shaft extends.
Figure 5:
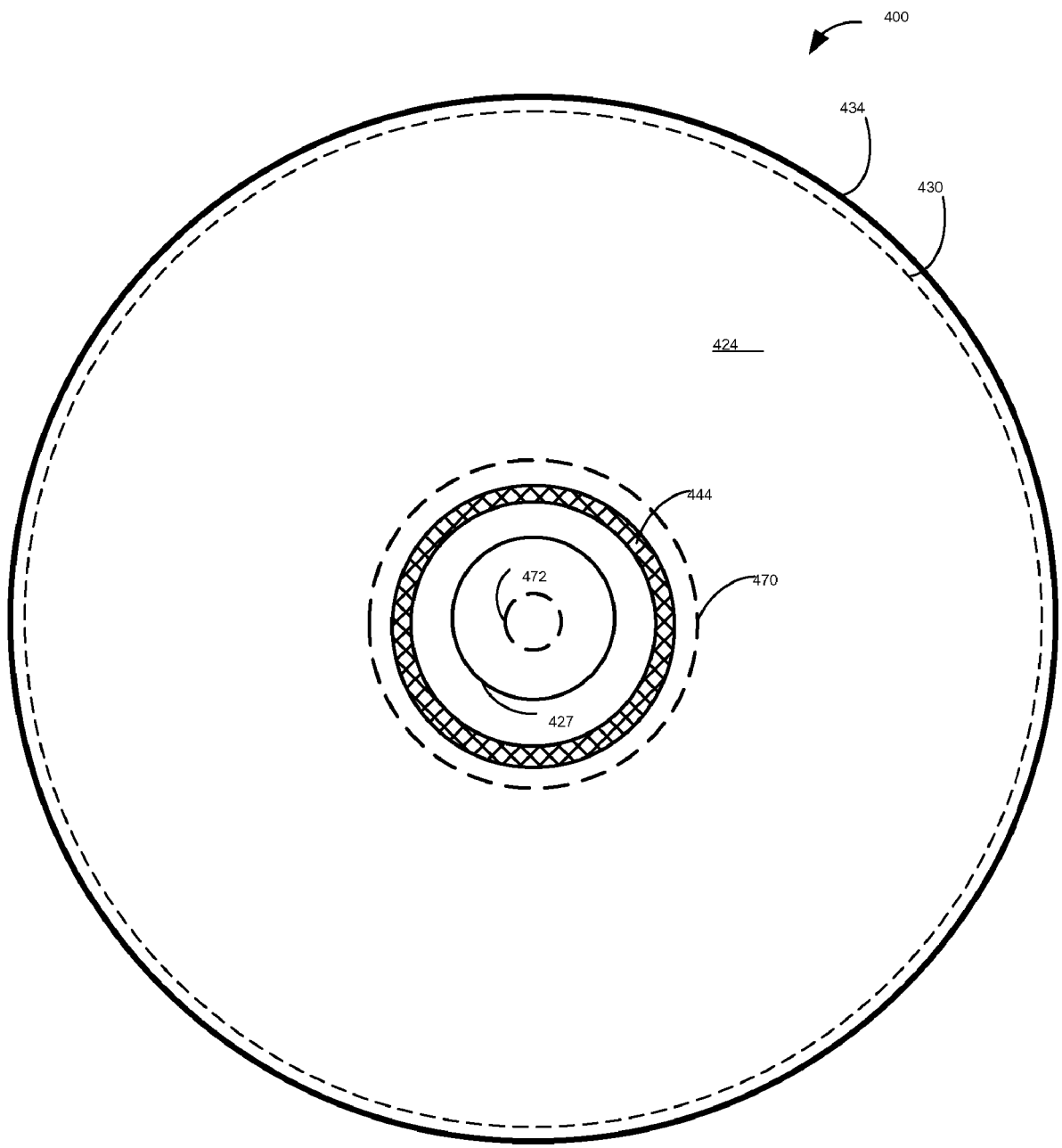
FIG. 5 is a rear view of the actuator assembly of FIG. 4 taken along line 5-5.

FIG. 4 and FIG. 5 illustrate an example first embodiment of actuator assembly 400. The actuator assembly 400 comprises a first diaphragm 422 and a second diaphragm 424 connected to the first diaphragm 422 for forming a chamber 426 between the first diaphragm 422 and the second diaphragm 424. An actuator shaft 427 is connected to first diaphragm 422 and is oriented to extend through the chamber 426 and to extend through an aperture 443 formed in the second diaphragm 424. Preferably the actuator shaft 427 is centrally mounted to the chamber-interior surface of first diaphragm 422, and the aperture 443 is centrally formed through second diaphragm 424.

The second diaphragm 424 can be connected to an actuator body 450 wherein the actuator shaft 427 performs an actuation operation. Since actuator assembly 400 can be manufactured and sold as a unit apart from actuator body 450, the optional nature of actuator body 450 is depicted by broken lines in FIG. 4. As shown in FIG. 4. actuator body 450 is connected to the second diaphragm 424 only at and around the aperture 443 formed in the second diaphragm 424. In view of such exclusive mounting, surface of the first diaphragm 422 and second diaphragm 424 which are exterior to the chamber 426 have no force mechanically applied thereto other than connection to the actuator body 450.

In the particular implementations and examples illustrated herein, both diaphragm 422 and diaphragm 424 are essentially circular-shaped diaphragms having an axial direction 436 and a longitudinal or diameter direction 438. While circular, oval, or elliptical shaped diaphragms are currently preferred, other shapes of diaphragms are also possible.

The actuator shaft 427 is connected to first diaphragm 422 to extend in the axial direction 436. The actuator shaft 427 can be affixed or mounted to first diaphragm 422 in various ways. For example, FIG. 4 and FIG. 5 show that first diaphragm 422 bears or carries an accessory or mounting fixture 470. The mounting fixture 470 can be inserted into a central aperture or the like provided in first diaphragm 422, or otherwise bonded, affixed, or applied to a central interior portion of first diaphragm 422. Mounting of a fixture or the like on a diaphragm is also described in U.S. Provisional Patent Application 60/670,650, filed Apr. 13, 2005, entitled "Valving Piezoelectric Diaphragm for Pump", which is incorporated herein by reference in its entirety. The particular mounting fixture 470 illustrated in FIG. 4 happens to have an essentially disk or shape and further includes a mounting pin 472 extending therefrom along axial direction 436. The mounting pin 472 can be exteriorly threaded or otherwise configured to mate with a (counterthreaded) bore formed in a proximal end of actuator shaft 427. The mounting fixture 470 can have other shapes and configurations (e.g., non-circular), and can engage actuator shaft 427 in ways other than threaded or other attachment. For example, mounting pin 472 can be formed integrally with mounting fixture 470.

In an illustrated example embodiment of actuator assembly 400, at least one of the first diaphragm 422 and the second diaphragm 424 is a piezoelectric diaphragm which displaces in accordance with application of an electrical signal. Accordingly, the actuator assembly 400 can be provided with a source 476 of electrical signal (e.g., a circuit) for displacing the first diaphragm 422 and the second diaphragm 424.

In terms of connecting the first diaphragm 422 and the second diaphragm 424, the first diaphragm 422 has a first diaphragm peripheral edge 428 and the second diaphragm 424 has a second diaphragm peripheral edge 430. The second diaphragm peripheral edge 430 is connected to the first diaphragm peripheral edge 428, either substantially entirely around a periphery of the actuator assembly or at discrete peripheral points around the actuator assembly. For example, a sealing gasket 432 may be inserted between edge 428 of diaphragm 422 and edge 430 of diaphragm 424, and an epoxy 434 or other adhesive or sealant applied externally over edge 428, edge 430, and sealing gasket 432. For example, in one non-limiting embodiment, the sealing gasket 432 and epoxy 434 reside essentially completely around the edges of the diaphragm 422 and diaphragm 424.

Figure 6:
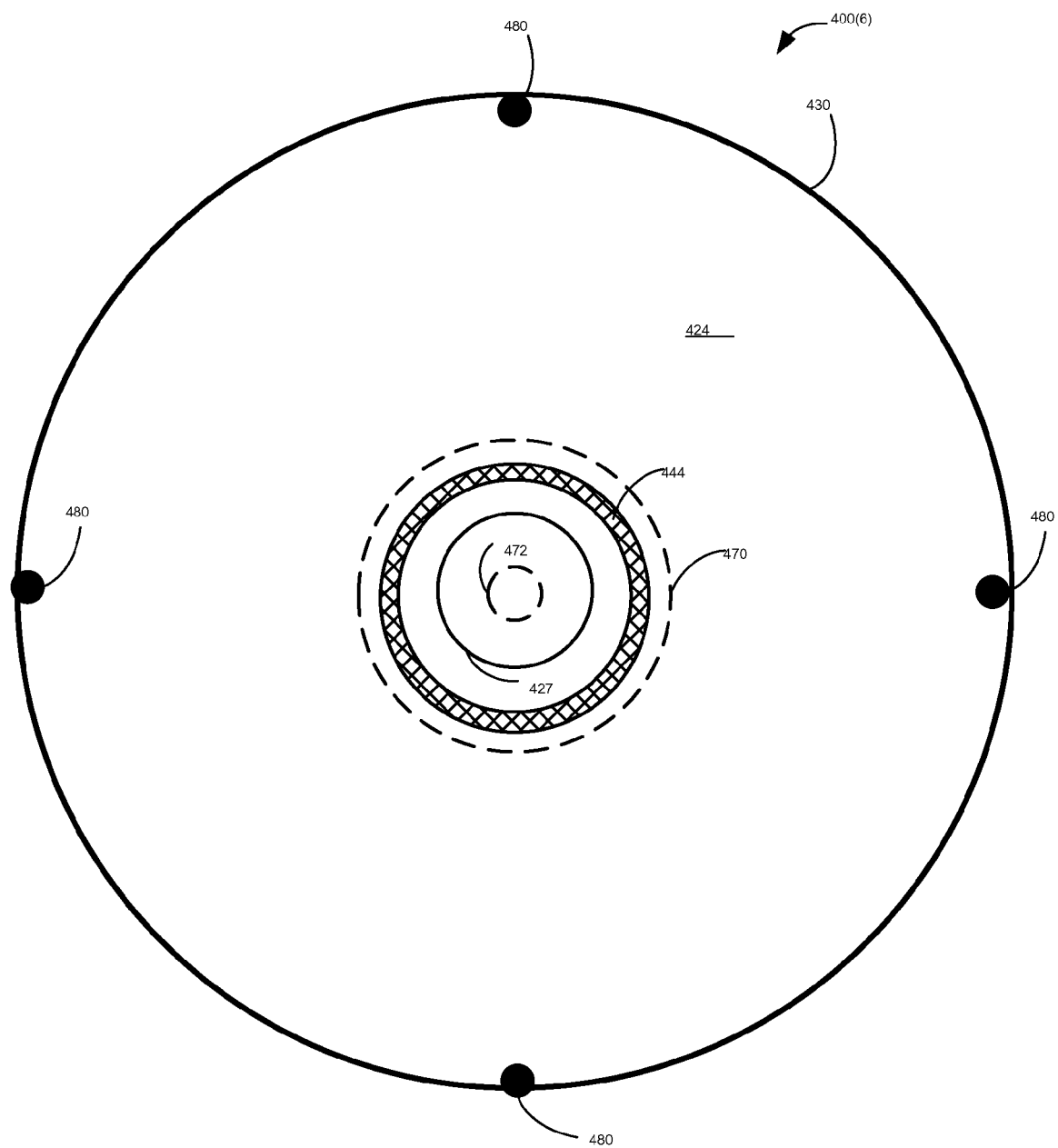
FIG. 6 is a rear view of an actuator assembly having discrete attachments points for attaching a first diaphragm to a second diaphragm.

Alternatively, the second diaphragm peripheral edge 430 can be connected to first diaphragm peripheral edge 428 at discrete peripheral points around the actuator assembly. In particular, FIG. 6 shows second diaphragm peripheral edge 430 connected by attachments points 480 to first diaphragm peripheral edge 428. Although four such attachments points 480 are illustrated, it will be appreciated that a different number of attachments points 480 can be provided and positioned in various fashions. Having a discrete number of attachments points 480 rather than a continuous bond can be advantageous in embodiments in which it is desired to have minimal edge condition restraint.

As mentioned above, the actuator assembly 400 can be connected directly to an actuator body such as actuator body 450 shown in FIG. 4. In this respect, the second diaphragm 424 can have a port 444 which at least partially defines the aperture 443 of the second diaphragm 424. The port 444 of the second diaphragm 424 can be configured for mating with the actuator body 450.

The port 444 can take the form of a toroidal bushing, sleeve, or the like, as illustrated in FIG. 4 and FIG. 5, having a central opening which extends in the axial direction 436. The actuator shaft 427 extends through the central opening of port 444. Although FIG. 4 and FIG. 5 show considerable clearance or tolerance between an inner circumferential wall of port 444 and actuator shaft 427, it should be understood that small clearance can be provided, even very little clearance, so long as actuator shaft 427 is able to slide within port 444. An appropriate sliding material or the like may form the interior circumferential surface of port 444, particularly when very small clearance is provided.

Figure 7A:
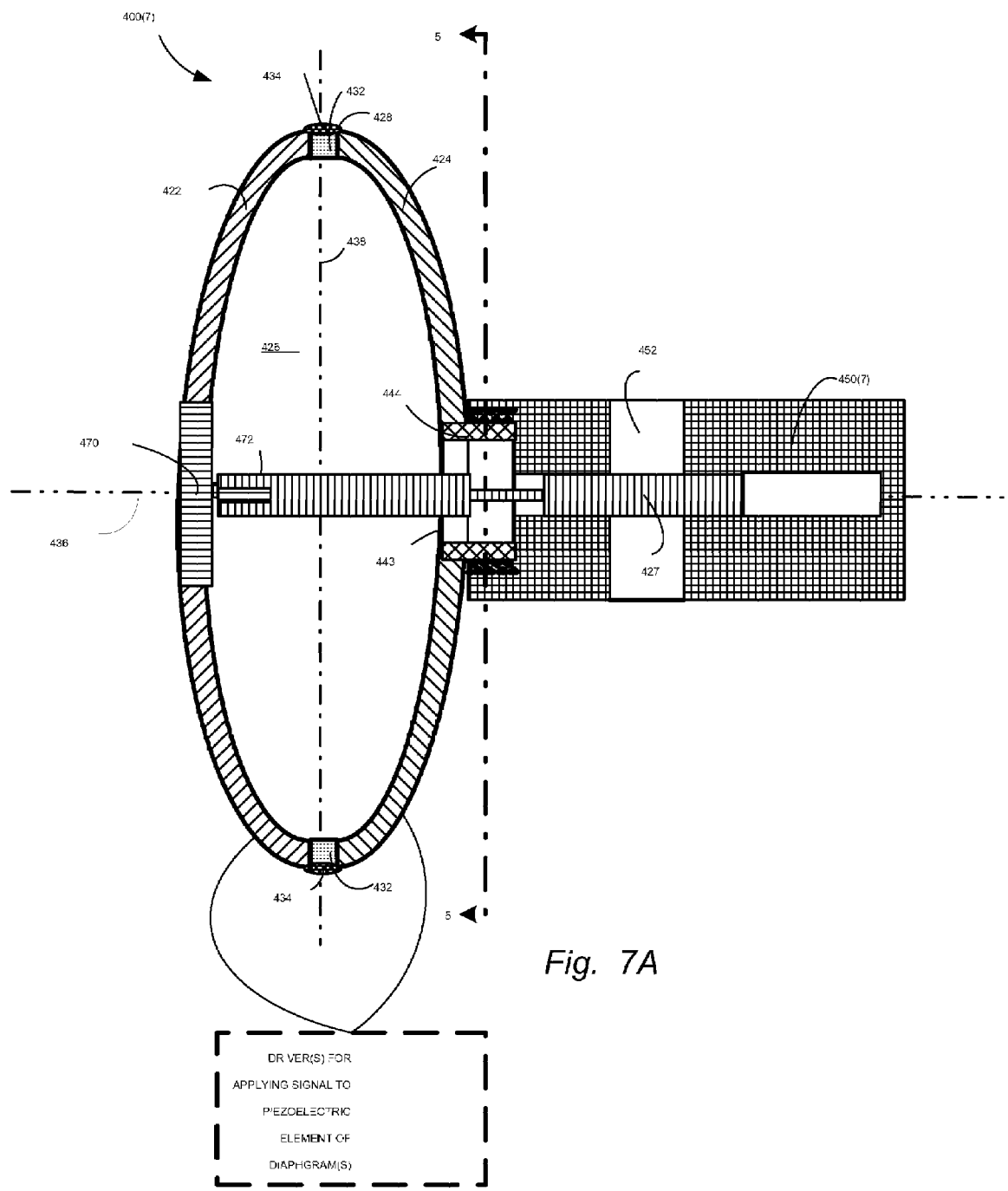
FIG. 7A is a cross sectioned side view of an example, non-limiting embodiment of an actuator assembly implemented as a spool valve, with an actuator shaft of the actuator assembly being in a withdrawn or retracted position.
Figure 7B:
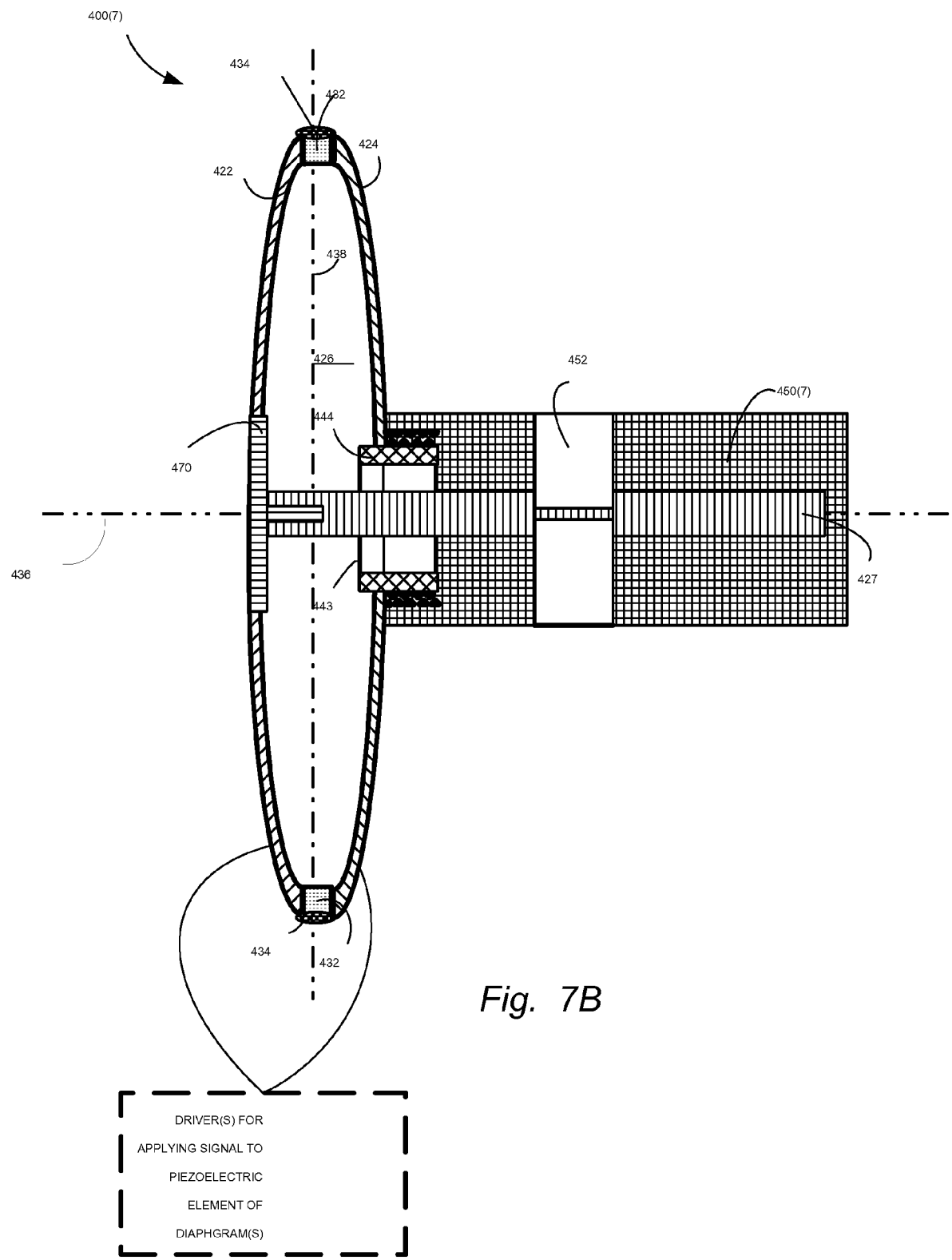
FIG. 7B is a cross sectioned side view of the actuator assembly of FIG. 7A with the actuator shaft being in an extended position.

The actuator shaft 427 is operable to extend through port 444 and into the actuator body 450. As illustrated in FIG. 7A and FIG. 7B, actuator body actuator body 450 can be (as one non-limiting example) a spool valve body for which the actuator shaft acts as a spool. FIG. 7A shows actuator assembly 400(7) in the form of a spool-type valve, with first diaphragm 422 and second diaphragm 424 actuated to a displaced or expanded position, e.g., a position at which first diaphragm 422 and second diaphragm 424 achieve a desired degree of deflection from an at-rest position. In the displaced or expanded position of FIG. 7A, actuator shaft 427 is withdrawn or retracted relative to actuator body 450(7) and blocking a transverse body port 452 of actuator body 450(7) so that fluid cannot flow through the transverse body port 452. On the other hand, FIG. 7B shows first diaphragm 422 and second diaphragm 424 actuated to an at-rest position (non-deflected position) wherein actuator shaft 427 is extended relative to actuator body 450(7) so that a narrowed diameter portion of actuator shaft 427 is aligned with body port 452, thereby permitting fluid to flow through the transverse body port 452. Of course, in an alternate implementation having a different structure of the actuator body 450(7), the extended position of actuator shaft 427 could instead serve to block or close the valve, and the retracted position of actuator shaft 427 could serve to open the valve.

FIG. 7A and FIG. 7B thus serve to illustrate movement of actuator shaft 427 relative to actuation of first diaphragm 422 and second diaphragm 424. In the illustrated example embodiments, actuation of first diaphragm 422 and second diaphragm 424 is accomplished by electrical signals applied thereto by signal source 476. The selective sliding, movement, or displacement of actuator shaft 427 for embodiments other than a spool valve implementation is understood with reference to FIG. 7A and FIG. 7B.

It should be appreciated that signals of various magnitudes can be applied to the first diaphragm 422 and second diaphragm 424, resulting in differing degrees of displacement or deflection of the diaphragms. While in some instances it may be desirable to drive the first diaphragm 422 and the second diaphragm 424 from a zero deflection position to a maximum deflection position, in other instances and/or applications an entire range of intermediate deflection/displacement positions may also be achieved, either consistently or selectively.

Figure 8A:
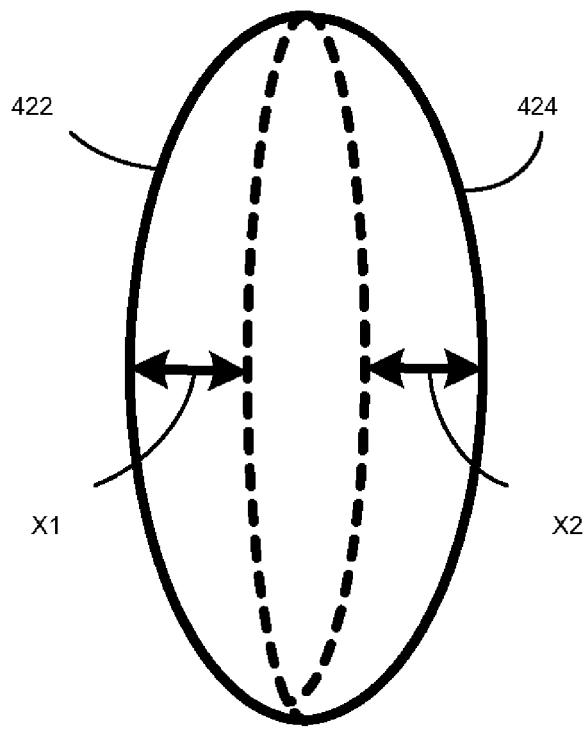
FIG. 8A is a diagrammatic view showing displacement amounts of a first diaphragm and a second diaphragm of an actuator assembly.
Figure 8B:
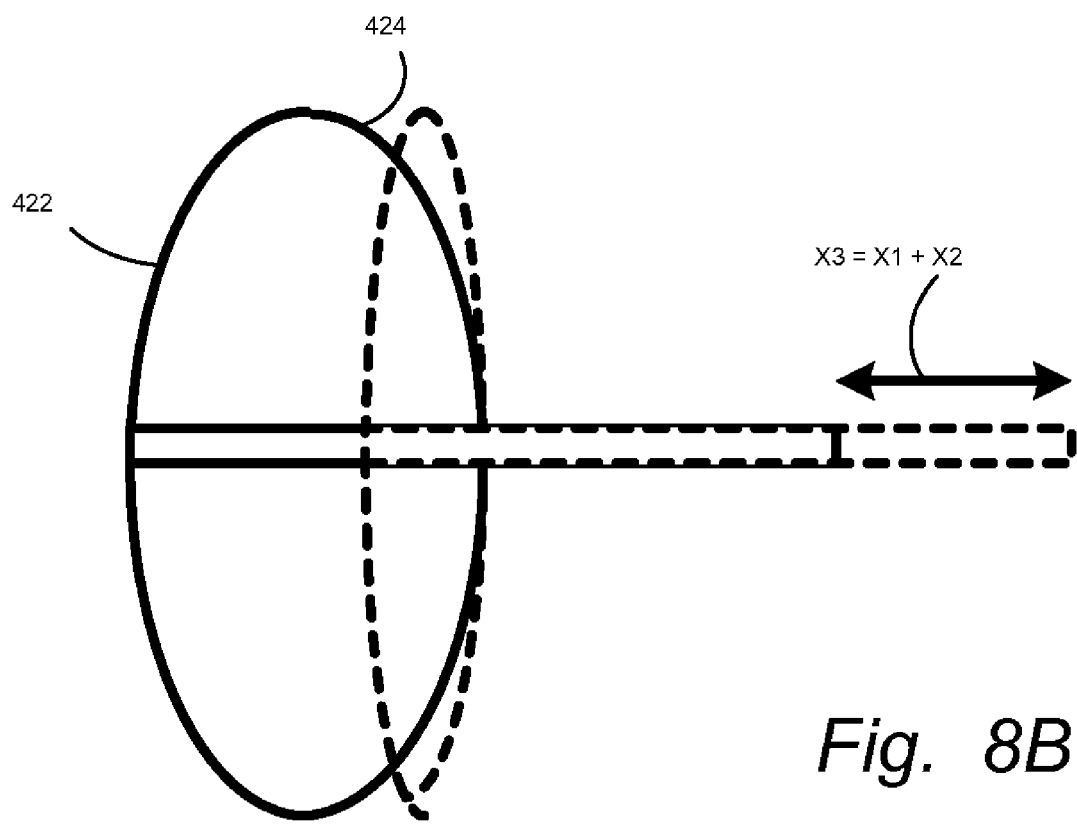
FIG. 8B is a diagrammatic view showing that displacements of the first diaphragm and the second diaphragm have an additive effect upon displacement of the actuator shaft.

The first diaphragm 422 and the second diaphragm 424 are preferably oriented so that their displacements (in accordance with the electrical signal) are additive. For example, and as illustrated in FIG. 8A and FIG. 8B, a displacement X1 of the first diaphragm 422 (from its at-rest or non-deflected position to a desired deflected position) and a displacement X2 of the second diaphragm 424 (from its at-rest or non-deflected position to its desired deflected position) results in a displacement X3=X1+X2 of the actuator shaft 427. In an illustrated example embodiment, the first diaphragm and the second diaphragm are essentially identical with respect to displacement upon application of a same electrical signal so that X1=X2.

In the example embodiments of actuator assembly thus far illustrated, and with respect to an interior of chamber 426, both the first diaphragm 422 and the second diaphragm 424 are concave. In the dual concave embodiments, both the first diaphragm 422 and the second diaphragm 424 have a same polarity signal applied thereto for activating the first diaphragm 422 and the second diaphragm 424, and thereby displacing the actuator shaft 427 by a displacement amount that is additive with respect to the displacements of the first diaphragm and the second diaphragm.

Figure 9A:
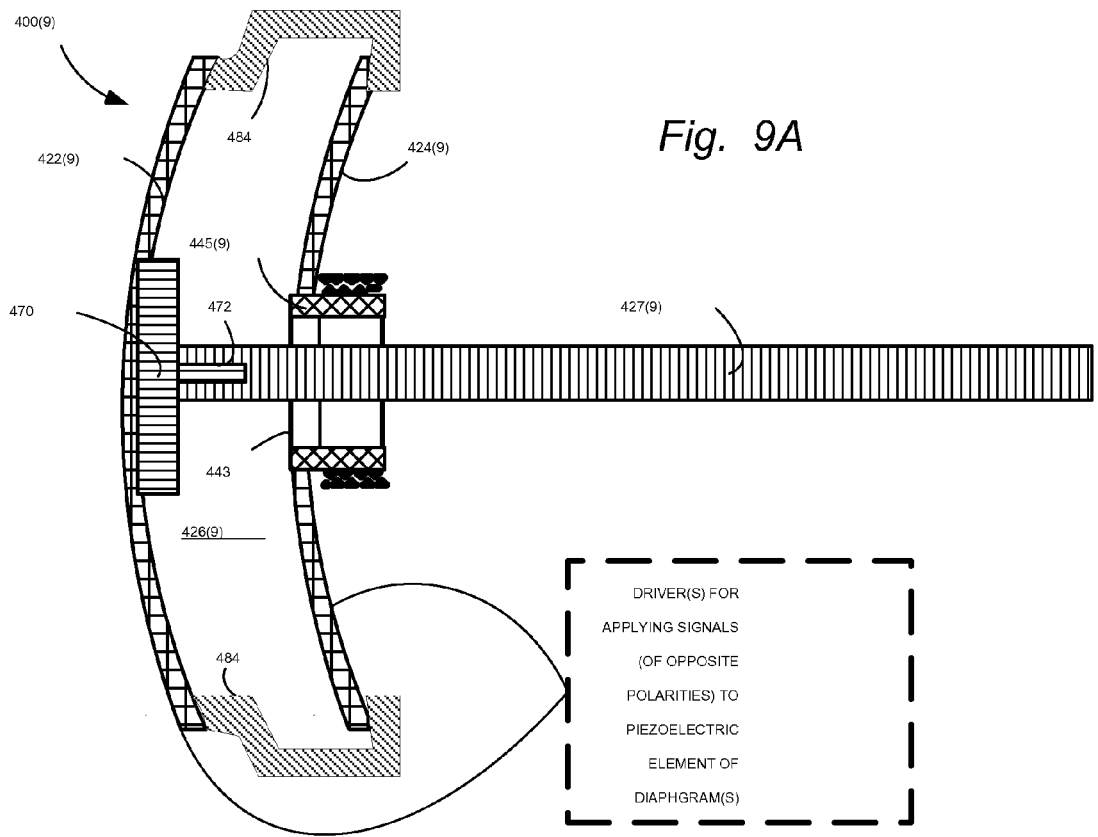
FIG. 9A is a cross sectioned side view of an example, non-limiting embodiment of an actuator assembly having a temperature compensation benefit and with an actuator shaft in a first position.
Figure 9B:
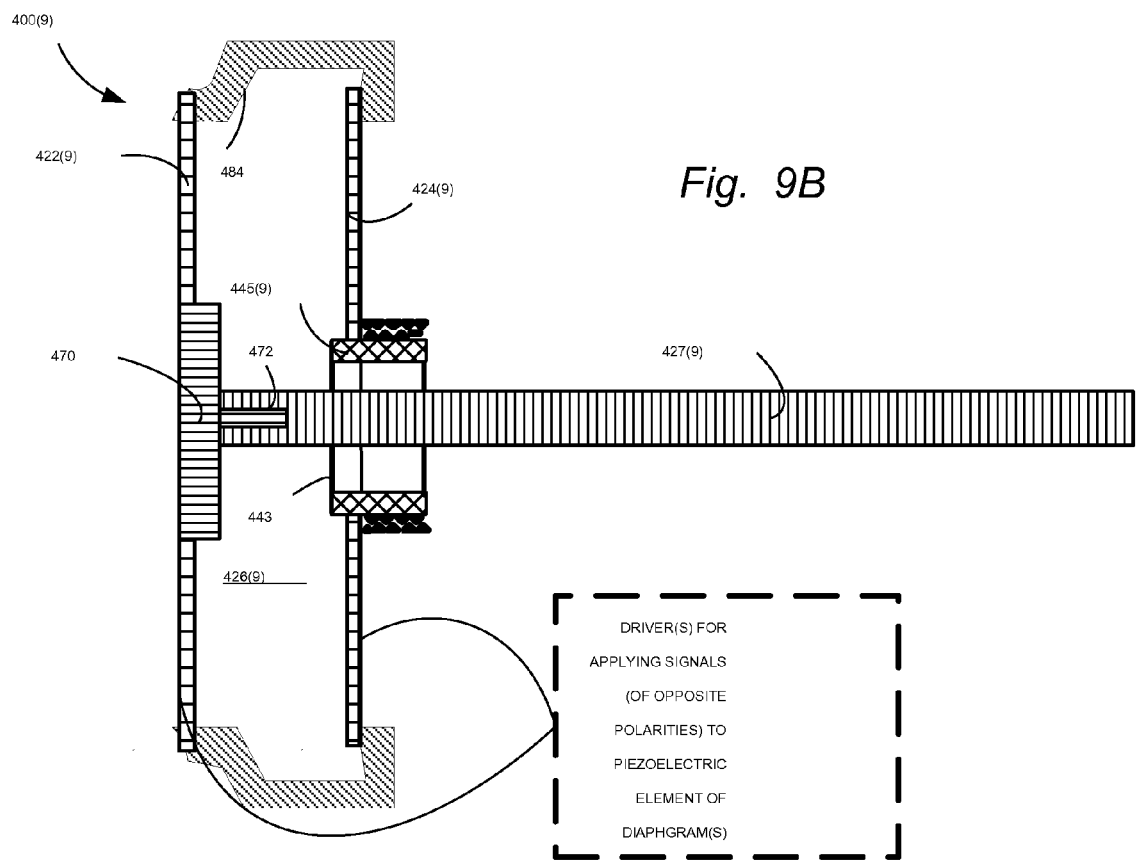
FIG. 9B is a cross sectioned side view of the actuator assembly of FIG. 9A with the actuator shaft being in a second position.

Another non-limiting, example embodiment actuator assembly 400(9) is illustrated in FIG. 9A and FIG. 9B. In the actuator assembly 400(9) of FIG. 9A and FIG. 9B, with respect to an interior of chamber 426 only one of the first diaphragm 422(9) and the second diaphragm 424(9) is concave as seen from the interior of chamber 426(9), and the other of the first diaphragm 422(9) and the second diaphragm is convex 424(9) as seen from the interior of chamber 426(9). In particular, first diaphragm 422(9) is concave and second diaphragm 424(9) is convex. Other configurations of orientation occur in other implementations. Rather than being edge attached in the manner of previous embodiments, the first diaphragm 422(9) and second diaphragm 424(9) are held or secured at their edges by/to a bracket-like edge clamp 484.

In this concave/convex embodiment of FIG. 9A and FIG. 9B, the first diaphragm 422(9) and the second diaphragm 424(9) have opposite polarity signals applied thereto for actuating/displacing the first diaphragm 422(9) and the second diaphragm 424(9). Not only is the actuator shaft 427(9) displaced by a displacement amount that is additive with respect to the displacements of the first diaphragm 422(9) and the second diaphragm 427(9) in the manner of FIG. 8A and FIG. 8B, but a temperature compensation benefit is also obtained. Such temperature compensation benefit, and other examples of how the first diaphragm 422(9) and second diaphragm 424(9) can be oriented, are explained in U.S. patent application Ser. No. 11/104,670, filed Apr. 13, 2005, entitled "ACTUATORS WITH DIAPHRAM AND METHODS OF OPERATING SAME", which is incorporated by reference herein in its entirety.

Figure 10:
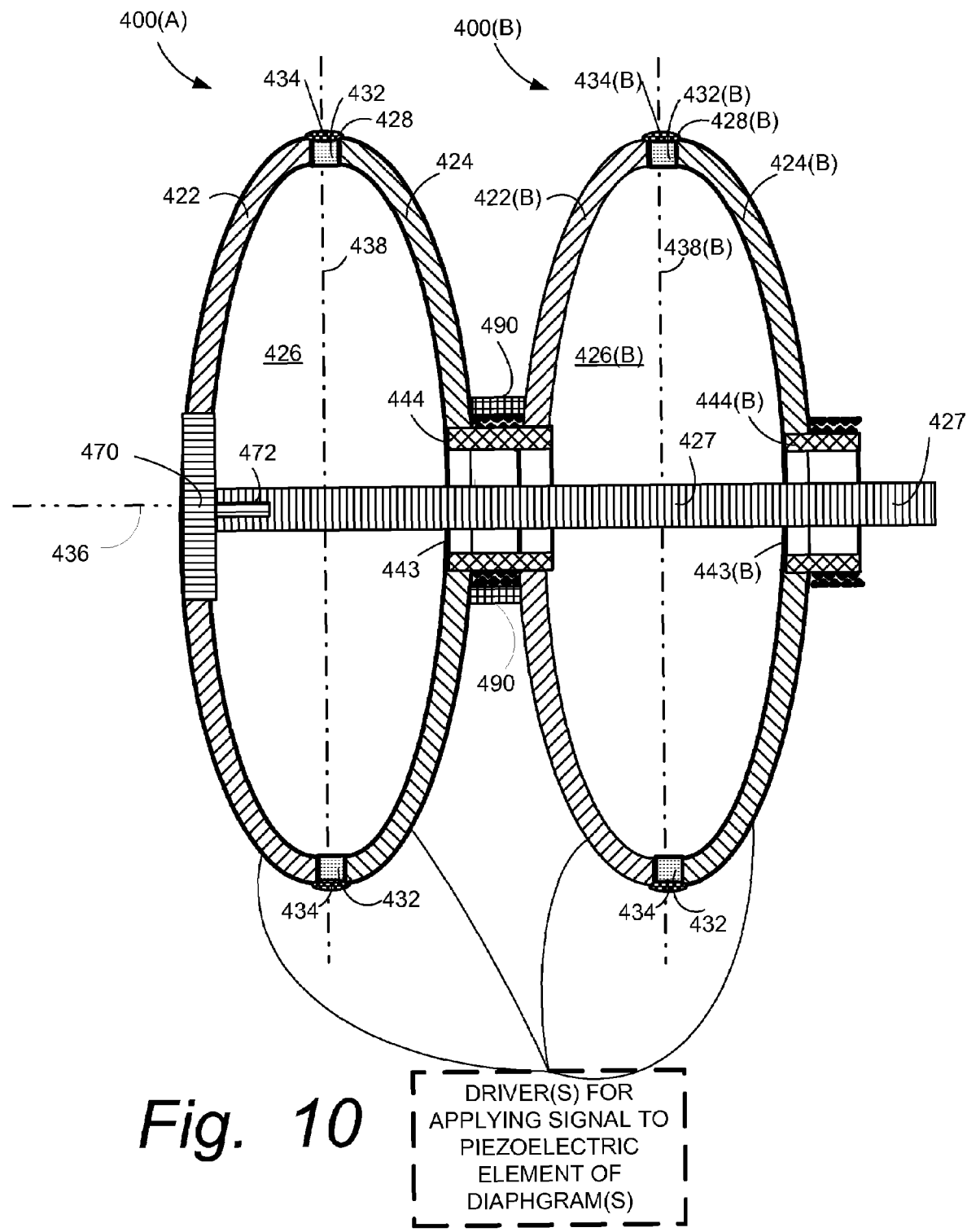
FIG. 10 is a cross sectioned side view of an example, non-limiting embodiment of an actuator assembly having an actuator amplification assembly connected thereto.

Rather than a second diaphragm of an actuator assembly being connected directly to an actuator body, alternatively one or more actuator amplification assemblies can be interposed between the second diaphragm and the actuator body. For example, port 444 of second diaphragm 424 of the actuator assembly 400(A) of FIG. 10 is configured for mating with an actuator amplification assembly 400(B). In the non-limiting, example embodiment illustrated in FIG. 10, the actuator amplification assembly 400(B) comprises a first actuator amplification assembly diaphragm 422(B) connected to a second actuator amplification assembly diaphragm 424(B) for forming an actuator amplification assembly chamber 426(B) therebetween. The first actuator amplification assembly diaphragm 422(B) has an actuator amplification assembly first diaphragm port 490 configured for mating with the port 444 of the second diaphragm 424, the second actuator amplification assembly diaphragm 424(B) has an actuator amplification assembly second diaphragm port 444(B) configured for mating with either a port of a further actuator amplification assembly or an actuator body. The actuator shaft 427, in addition to extending through the chamber 426 defined by the first diaphragm 422 and the second diaphragm 424, also extends through the actuator amplification assembly first diaphragm port 490, through the actuator amplification assembly chamber 426(B), and protrudes from the actuator amplification assembly second diaphragm port 444(B). One or more actuator amplification assemblies 400(B) can be telescoped or cascaded together for amplifying the displacement of the actuator shaft 427. A terminal one of the actuator amplification assemblies preferably has a port configured for mating with an actuator body within which the actuator shaft is operable for performing its selective function.

Multiple actuator amplification assemblies 400(B) can be telescoped or cascaded until the desired stroke for actuator shaft 427 is achieved. The actuator amplification assemblies can take the form of any of the actuator assembly assemblies illustrated herein, including but not limited to the form of the dual concave implementation, or the temperature compensation variation. The actuator shaft 427 extends through the entire stack of actuator amplification assemblies and is fastened to the first diaphragm 422 of the initial actuator assembly 400. The multiple actuator amplification assembly design still requires only a simple single point mount and the "free floating" nature of the stack of actuator amplification assemblies means that multiple diaphragms can be jointed without worry of tedious inter-diaphragm mounting concerns.

The ports formed on the actuator assembly or the actuator amplification assembly(ies) can be configured for mating in various ways, such as by internal (female) or external (male) threading, for example.

At least one and preferably both of the first diaphragm and the second diaphragm are piezoelectric diaphragms which displace in accordance with application of an electrical signal. As an example, each of first diaphragm and second diaphragm can be a multi-layered laminate which comprises a piezoelectric wafer which is laminated to/between one or more ruggedizing layers (e.g., metal layers), e.g., laminated by an adhesive between a metallic substrate layer and an outer metal layer. Structures of the multi-layered laminate which serve as the diaphragms, and processes for fabricating the same, are described in one or more of the following: PCT Patent Application PCT/US01/28947, filed 14 Sep. 2001; U.S. patent application Ser. No. 10/380,547, filed Mar. 17, 2003, entitled "Piezoelectric Actuator and Pump Using Same"; U.S. patent application Ser. No. 10/380,589, filed Mar. 17, 2003, entitled "Piezoelectric Actuator and Pump Using Same", and U.S. Provisional Patent Application 60/670,692, filed Apr. 13, 2005, entitled "PIEZOELECTRIC DIAPHRAGM ASSEMBLY WITH CONDUCTORS ON FLEXIBLE FILM", all of which are incorporated herein by reference.

Examples of appropriate drive electronics are included among those described in U.S. patent application Ser. No. 10/816,000, filed Apr. 2, 2004 by Vogeley et al., entitled "Piezoelectric Devices and Methods and Circuits for Driving Same", which is incorporated herein by reference in its entirety, or by documents referenced and/or incorporated by reference therein.

Although various embodiments have been shown and described in detail, the claims are not limited to any particular embodiment or example. None of the above description should be read as implying that any particular element, step, range, or function is essential such that it must be included in the claims scope. The scope of patented subject matter is defined only by the claims. The extent of legal protection is defined by the words recited in the allowed claims and their equivalents. It is to be understood that the invention is not to be limited to the disclosed embodiment, but on the contrary, is intended to cover various modifications and equivalent arrangements.

What is claimed is:

1. An actuator assembly comprising:
   a first diaphragm;
   a second diaphragm, the second diaphragm being connected to the first diaphragm for forming a chamber therebetween, the second diaphragm having an aperture formed therein;
   an actuator shaft connected to first diaphragm and oriented to extend through the chamber and to extend through and protrude from the aperture formed in the second diaphragm;
   an actuator body connected to the second diaphragm only at the aperture formed in the second diaphragm wherein at least one of the first diaphragm and the second diaphragm being a piezoelectric diaphragm which displaces in accordance with application of an electrical signal.

2. The apparatus of claim 1, further comprising a source of the electrical signal for displacing the first diaphragm and the second diaphragm.

3. The apparatus of claim 1, wherein the first diaphragm has a first diaphragm peripheral edge and the second diaphragm has a second diaphragm peripheral edge, and wherein the second diaphragm peripheral edge is connected to the first diaphragm peripheral edge.

4. The apparatus of claim 3, wherein the second diaphragm peripheral edge is connected to the first diaphragm peripheral edge substantially entirely around the first diaphragm peripheral edge and the second diaphragm peripheral edge.

5. The apparatus of claim 3, wherein the second diaphragm peripheral edge is connected at discrete peripheral locations to the first diaphragm peripheral edge.

6. The apparatus of claim 1, wherein the first diaphragm and the second diaphragm are oriented so that a displacement X1 of the first diaphragm and a displacement X2 of the second diaphragm results in a displacement X1+X2 of the actuator shaft.

7. The apparatus of claim 6, wherein the first diaphragm and the second diaphragm are essentially identical with respect to displacement upon application of a same electrical signal so that X1=X2.

8. The apparatus of claim the 1, wherein with respect to an interior of the chamber both the first diaphragm and the second diaphragm are concave, and wherein both the first diaphragm and the second diaphragm have a same polarity signal applied thereto for activating the first diaphragm and the second diaphragm.

9. The apparatus of claim the 1, wherein with respect to an interior of the chamber one of the first diaphragm and the second diaphragm is concave and another of the first diaphragm and the second diaphragm is convex, and wherein the first diaphragm and the second diaphragm have opposite polarity signals applied thereto for activating the first diaphragm and the second diaphragm.

10. The apparatus of claim the 1, wherein the second diaphragm has a port which at least partially defines the aperture, and wherein the port is configured for mating with an actuator body.

11. The apparatus of claim the 1, further comprising an actuator body, wherein the second diaphragm has a port which at least partially defines the aperture, wherein the port is configured for mating with the actuator body, and wherein the actuator shaft extends into the actuator body.

12. The apparatus of claim the 11, wherein the actuator body comprises a spool valve for which the actuator shaft acts as a spool.

13. The apparatus of claim 1, wherein surfaces of the first diaphragm and second diaphragm which are exterior to the chamber have no force mechanically applied thereto other than connection to the actuator body.

14. An actuator assembly comprising:

a first diaphragm;

a second diaphragm, the second diaphragm being connected to the first diaphragm for forming a chamber therebetween, the second diaphragm having an aperture formed therein;

an actuator shaft connected to first diaphragm and oriented to extend through the chamber and to extend through and protrude from the aperture formed in the second diaphragm;

wherein the second diaphragm has a port which at least partially defines the aperture, wherein the port is configured for mating with an actuator amplification assembly, the actuator amplification assembly comprising:

a first actuator amplification assembly diaphragm, the first actuator amplification assembly diaphragm having an actuator amplification assembly first diaphragm port configured for mating with the port of the second diaphragm;

a second actuator amplification assembly diaphragm, the second actuator amplification assembly diaphragm having an actuator amplification assembly second diaphragm port configured for mating with either a port of a further actuator amplification assembly or an actuator body;

the actuator amplification assembly second diaphragm being connected to the actuator amplification assembly first diaphragm for forming an actuator amplification assembly chamber therebetween;

wherein the actuator shaft also extends through the actuator amplification assembly first diaphragm port, through the actuator amplification assembly chamber, and protrudes from the actuator amplification assembly second diaphragm port.

15. The apparatus of claim 14, wherein the port of the second diaphragm is threaded for mating with the actuator amplification assembly.

* * * * *